(12) United States Patent
Ulriksson et al.

(10) Patent No.: US 8,547,743 B2
(45) Date of Patent: Oct. 1, 2013

(54) READ ERROR RECOVERY FOR SOLID-STATE MEMORY BASED ON CUMULATIVE BACKGROUND CHARGES

(75) Inventors: Bengt Anders Ulriksson, Milford, MA (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 162 days.

(21) Appl. No.: 13/170,501

(22) Filed: Jun. 28, 2011

(65) Prior Publication Data

US 2013/0003459 A1 Jan. 3, 2013

(51) Int. Cl.
*G11C 16/04* (2006.01)
(52) U.S. Cl.
USPC .............................. 365/185.17; 365/185.09
(58) Field of Classification Search
USPC ........................................ 365/185.01–185.33
See application file for complete search history.

(56) References Cited

U.S. PATENT DOCUMENTS

| 6,925,007 | B2* | 8/2005 | Harari et al. | ............ 365/185.15 |
| 7,196,946 | B2 | 3/2007 | Chen et al. | |
| 7,341,918 | B2* | 3/2008 | Harari et al. | ................ 438/287 |
| 7,342,279 | B2* | 3/2008 | Harari et al. | ................ 257/324 |
| 7,479,677 | B2* | 1/2009 | Harari et al. | ................ 257/324 |
| 7,579,247 | B2* | 8/2009 | Harari et al. | ................ 438/287 |
| 7,834,392 | B2* | 11/2010 | Harari et al. | ................ 257/324 |
| 7,876,611 | B2 | 1/2011 | Dutta et al. | |
| 2003/0080370 | A1* | 5/2003 | Harari et al. | ................ 257/314 |
| 2003/0109093 | A1* | 6/2003 | Harari et al. | ................ 438/200 |
| 2005/0157551 | A1* | 7/2005 | Harari et al. | ............ 365/185.03 |
| 2005/0180210 | A1* | 8/2005 | Harari et al. | ............ 365/185.03 |
| 2008/0116509 | A1* | 5/2008 | Harari et al. | ................ 257/324 |
| 2008/0119026 | A1* | 5/2008 | Harari et al. | ................ 438/288 |
| 2009/0286370 | A1* | 11/2009 | Harari et al. | ................ 438/266 |
| 2010/0157678 | A1 | 6/2010 | Mokhlesi | |

OTHER PUBLICATIONS

Park et al., "A Zeroing Cell-to-Cell Interface Page Architecture with Temporary LSB Storing and Parallel MSB Program Scheme for MLC NAND Flash Memories", IEE Journal of Solid-State Circuits, vol. 43, No. 4, Apr. 2008, pp. 919-928.

* cited by examiner

*Primary Examiner* — Harry W Byrne
(74) *Attorney, Agent, or Firm* — Hollingsworth Davis, LLC

(57) ABSTRACT

A read error is determined that affects a page of solid-state, non-volatile memory. The page is associated with a selected word line that crosses a plurality of NAND strings coupled to respective grounds and bit lines. Word lines of the memory are ordered from a lower end proximate the ground to a higher end proximate the bit lines. Cumulative background charges each associated with one of the memory cells of the page are determined. The cumulative background charges are based on charge levels of respective cells of a plural subset of the word lines that are lower in order than the selected word line. A recovery operation is performed on the page using the cumulative background charges.

20 Claims, 8 Drawing Sheets

FIG. 8

READ ERROR RECOVERY FOR SOLID-STATE MEMORY BASED ON CUMULATIVE BACKGROUND CHARGES

SUMMARY

The present disclosure is related to systems and methods for read error recovery for solid-state memory. For example, in one embodiment, a method involves determining a read error affecting a page of solid-state, non-volatile memory. The page is associated with a selected word line that crosses a plurality of NAND strings coupled to respective grounds and bit lines. Word lines of the memory are ordered from a lower end proximate the ground to a higher end proximate the bit lines. Cumulative background charges are determined, each associated with one of the memory cells of the page,. The cumulative background charges are based on charge levels of respective cells of a plural subset of the word lines that are lower in order than the selected word line. A recovery operation is performed on the page using the cumulative background charges.

In another embodiment, an apparatus includes a controller capable of being coupled to a non-volatile, solid-state memory. The memory includes a plurality of NAND strings coupled to respective grounds and bit lines. A plurality of word lines of the memory are ordered from a lower end proximate the ground to a higher end proximate the bit lines. The controller is configured to determine a read error affecting a page associated with a selected word line of the plurality of word lines, and determine cumulative background charges each associated with one of the memory cells of the page. The cumulative background charges are based on charge levels of respective cells of a plural subset of the word lines that are lower in order than the selected word line. The controller is also configured to perform a recovery operation on the page using the cumulative background charges.

In another embodiment, an apparatus includes a controller capable of being coupled to a non-volatile, solid-state memory. The memory includes a plurality of NAND strings coupled to respective grounds and bit lines. A plurality of pages of the memory are ordered from a lower end proximate the ground to a higher end proximate the bit lines. The controller is configured to: determine a read error affecting a selected one of the pages; perform a summing operation on symbol data of a plural subset of the pages that are lower in order than the selected page; and perform a recovery operation on the page using a result of the summing operation.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

DETAILED DESCRIPTION

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the present invention.

The present disclosure is generally related to apparatuses, systems and methods that facilitate correcting for data retention errors in non-volatile, solid-state memory. Data retention errors are the result of leakage of charge over time from solid-state cells used to store information. Depending on the amount of wear on the cell, this charge loss may cause significant read errors over some relatively long period of time, e.g. months. In memory configurations such as NAND flash memory, this degradation of charge has been found to be more pronounced for certain pages of memory that are at "higher" locations along a string of NAND cells arranged in series.

Generally, non-volatile solid-state storage such as flash memory (which includes both NAND and NOR flash memory), stores data in cells similar to a metal-oxide semiconductor (MOS) field-effect transistor (FET), e.g., having a gate (control gate), a drain, and a source. The drain and the source are connected by the channel. In addition, the memory cell includes what is known as a "floating gate." The transistor threshold voltage can be changed by varying the amount of charge stored on the floating gate. When a selected voltage is applied to the control gate, differing values of current may flow through the channel depending on the value of the threshold voltage. This current flow can be used to characterize two or more states of the cell that represent data stored in the cell.

The number of electrons on the floating gate determines a threshold voltage level of the cell, and the threshold voltage does not change significantly upon removal of power to the cell. This characteristic of the floating gate facilitates persistent storage of the data in the cell. The charge stored on the floating gate can be changed by applying an elevated voltage to the control gate, thereby changing data stored in the cell. A relatively high reverse voltage can be applied to the control gate to return the cell to an initial, "erased" state.

Flash memory is sometimes broken into two categories: single-level cell (SLC) and multi-level cell (MLC). In SLC flash memory, two voltage levels are used to characterize a state of each cell, thus allowing SLC flash memory to store one bit of information per cell. In MLC flash memory, more than two voltage levels are used to characterize a state of each cell, thus allowing MLC flash memory to store more than one bit per cell. Although MLC flash memory is capable of storing more bits per cell than SLC flash memory, MLC flash memory often suffers more from degradation/wear due to repeated use than does SLC flash memory.

A NAND flash memory consists of a number of floating gate FET transistors connected in series in a string. The number of FET transistors per string equals the number of word lines per block. Each word line may be divided into several pages dependent on the number of bits per symbol. As the flash memory cells become worn, they are increasingly sensitive to both disturbance and retention effects. Disturbance effects relate to changes in charge state of the cells caused by data access operations (e.g., writes, reads) that are being performed on spatially adjacent cells. Retention effects are due to loss of charge in the cell over some period of time. This period of time may vary depending on the type of flash and other conditions. For purposes of this disclosure, retention effects occur on a time scale (e.g., days, weeks) that distinguishes it from other, more dynamic effects. Of example, charge loss due to data retention effects is considered to occur independently of disturbance. Charge loss is also temperature dependent, and high temperatures can significantly accelerate the loss of charge over time.

Figure 1:
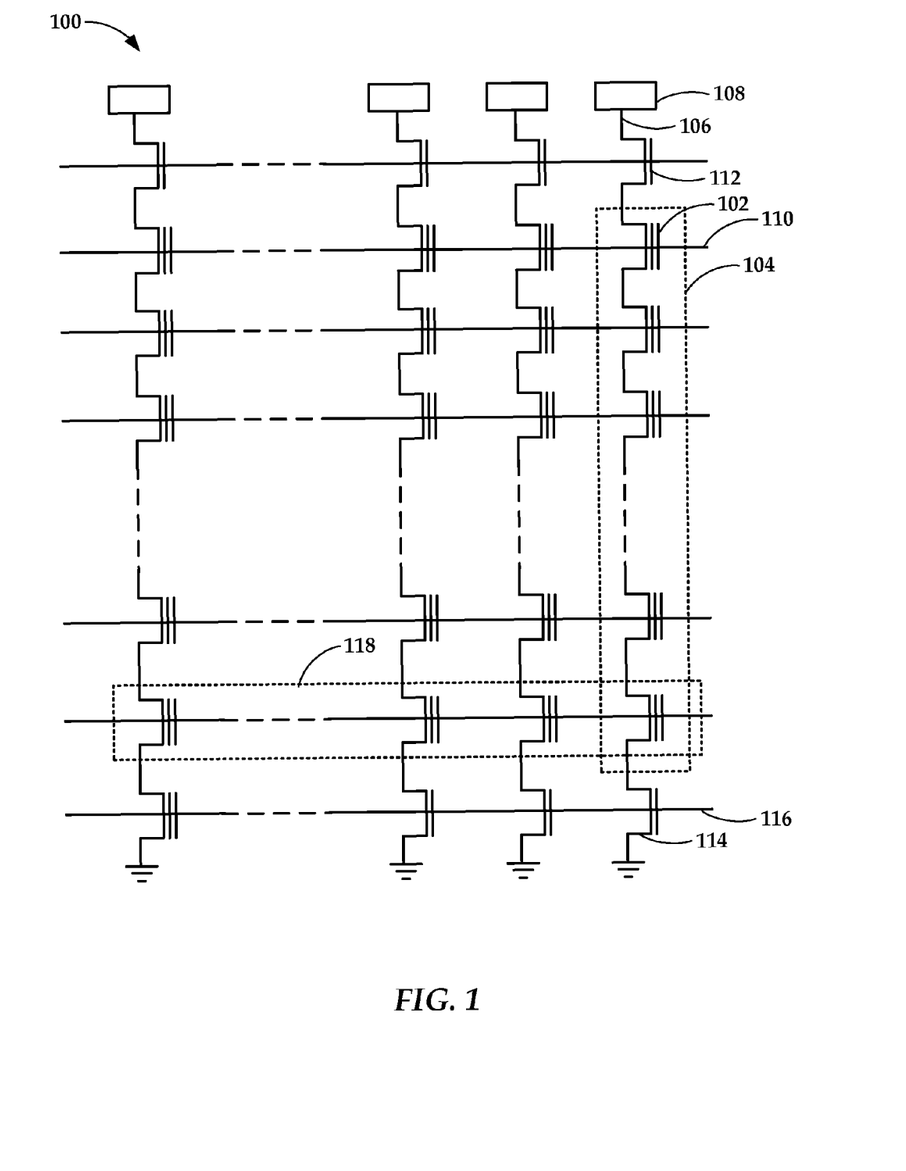
FIG. 1 is a schematic diagram of a memory array according to an example embodiment.

In reference now to FIG. 1, a block diagram illustrates an array 100 of memory cells according to an example embodiment. The array 100 includes a plurality of floating-gate transistor memory cells (e.g., cell 102) connected in series, in what are generally referred to as a NAND strings (e.g., string 104). As a result, this type of array 100 is known as NAND flash memory. Each NAND string is coupled to a bit line (e.g., bit line 106) from which a symbol can be read via an output bus (e.g., bus 108).

The cells of adjacent NAND strings are coupled via word lines (e.g., word line 110) that select which row of memory cells will be affected by reading and programming operations. Select gates 112, 114 also selectably couple the NAND strings to respective bit lines and ground during reading and program operations. Generally, each word line may be associated with one or more pages (e.g., page(s) 118), which are the smallest physically addressable data unit. The size of the page in bits (which may include both user data and error correction codes, or ECC) corresponds to the number of NAND strings in the word line. An MLC memory array will store multiple pages on a word line by assigning each bit of a given cell to different pages.

Figure 2A:
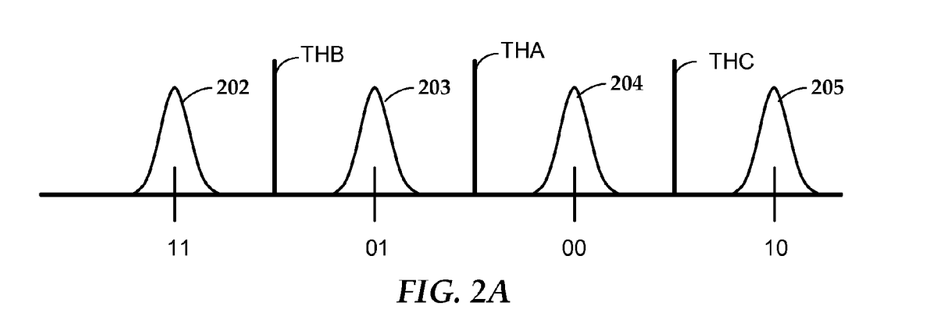
FIGS. 2A and 2B are graphs illustrating data retention errors according to an example embodiment.

Flash memory retains state by charging a floating gate to a particular voltage. This results in a predefined amount of current flowing through the channel when a specified read voltage is applied. This can be seen in FIG. 2A which illustrates threshold voltage distributions for an MLC memory array capable of storing two bits per memory cell. It will be appreciated that the illustrated MLC voltage distributions in FIG. 2A are provided for purposes of illustration, and not limitation. The concepts described herein may be equally applicable to other types of non-volatile, solid-state memory cells, including those with fewer or greater bits of data per cell.

Generally, when a flash cell is read, a voltage equal to the voltages THB, THA, and THC is applied sequentially to the control gate of the cell. The MOSFET channel will become conducting or remain insulating, depending on the applied voltage and the charge on the floating gate. The presence or absence of channel current given the set of read voltages, determines what data is currently stored in the cell. Voltage distributions 202-205 represent an ideal range of threshold voltages for representing one of four different data symbols.

In the example of FIG. 2A, the digital symbol "11" corresponds to the lowest read voltage distribution 202, and usually represents the erased state. Voltage distribution 203 is associated with digital symbol "01", voltage distribution 204 is associated with the digital symbol "00", and voltage distribution 205 is associated with the digital symbol "10". This composition and arrangement of symbols (also referred to herein as $L_0$-$L_3$), where each subsequent symbol changes by one bit, is known as a Gray code. Use of a Grey code ensures that erroneous voltage readings that cross boundaries THB, THA, and THC only result in a single bit error. Other Gray code sequences may also be used with the distributions shown in FIG. 2A, such as "11," "10," "00," and "01," For each digital symbol, the digit on the left is the most significant bit (MSB) and the digit on the right is the least significant bit (LSB). As will be discussed in greater detail below, the rightmost voltages distributions (which represent the greatest difference from the erased state at 202) in this Gray code series both have LSB of "0."

In order to write/program a solid-state memory cell (assuming that the cell is in a state ready for programming, e.g., erased), controller circuitry applies a voltage to the control gate of the cells until the floating gate is charged to the desired threshold voltage associated with the data being written. Right after programming (assuming cells are not overly worn or defective) the distributions are expected to be with ranges shown by distributions 202-205. However, after the passage of time, some of these values may change, as shown in FIG. 2B.

Figure 2B:
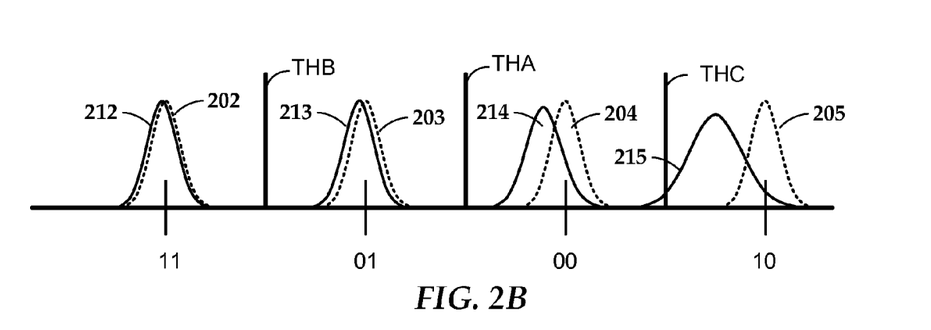

In FIG. 2B, distributions 212-215 represent a change in the original detected cell threshold voltages for a population of memory cells after passage of time. The original distributions 202-205 are shown in dashed lines for purposes of comparison. Through charge leakage the threshold voltages exhibit some drift from their initial states. This drift may affect both the average and width (e.g., standard deviation) of the distributions 202-205. An isolated flash cell will, on the average, lose charge proportional to the stored charge, e.g., a cell with symbol $L_3$ will lose charge at a faster rate than a cell with symbol $L_2$. Cells with either $L_0$ or $L_1$ symbols may experience relatively little charge loss in comparison. This is indicated in FIG. 2B where distributions 214, 215 exhibit a greater charge difference from the erased state (distribution 202) than do distributions 212 and 213. These leakage effects may become even more pronounced as the cells become more worn (e.g., have been subjected to some number of program-erase cycles).

Table 1 below shows results of an experiment that involved comparing symbols that were written (after the media was subjected to 45 k program/erase cycles) to what was later read back after a three-month retention time. The table only shows a count of erroneous readings. The symbol designators are listed in increasing levels of threshold voltage such that symbol "10" has the highest threshold voltage level, which corresponds to charge on the floating gate. As Table 1 demonstrates, the majority of errors are due to symbols "00" and "10" losing charge, and be read back as "01" and "00", respectively. These two symbols are found when the least significant bit (LSB) equals zero, which is equivalent to the value read from the LSB page of each word line.

TABLE 1

|  |  | Read Symbol | | | |
| --- | --- | --- | --- | --- | --- |
|  |  | 11 | 01 | 00 | 10 |
| Written | 11 |  | 0 | 4 | 3 |
| Symbol | 01 | 978 |  | 8 | 0 |
|  | 00 | 2 | 13918 |  | 0 |
|  | 10 | 0 | 2 | 30010 |  |

It has also been found that errors due to charge leakage are dependent, in addition to the symbol values, on where a page within a block of memory is located. In reference again to FIG. 1, word line 116 represents the lowest order page(s), due to its proximity to ground. Accordingly, word line 110 represents the highest number page(s) due its proximity to the bit lines. The pages in each block are programmed sequentially, from lowest to highest. This is due to disturb effects, where operations (e.g., read, program) on one cell affect immediately adjacent cells, both along the word lines and along the NAND strings. Because they are programmed first, the lowest pages are subject to more program disturb after programming compared to the highest pages. The lowest pages may therefore have a larger number of incorrect bits directly after programming than higher pages. This is represented generally by the graph of FIG. 3.

Figure 3:
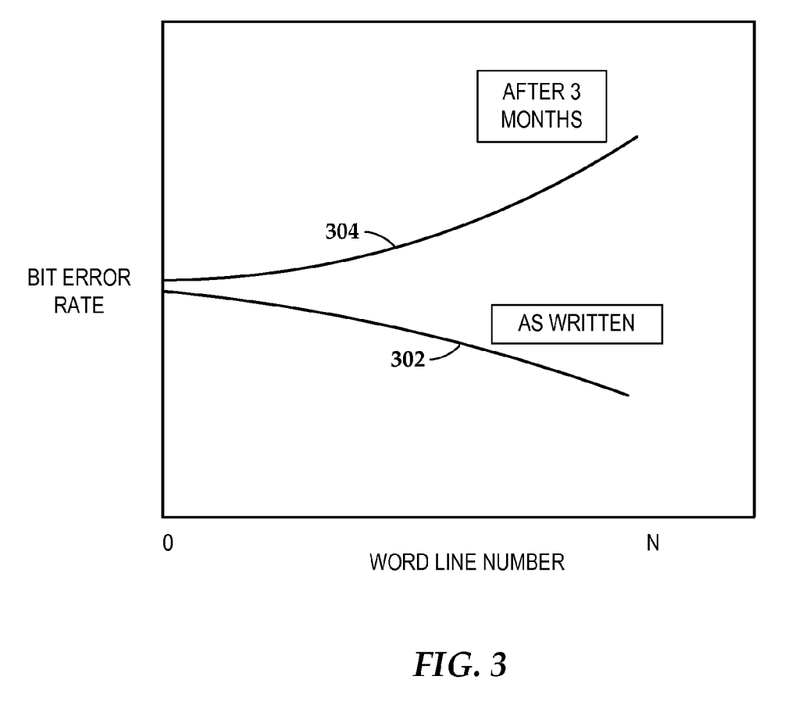
FIG. 3 is a graph illustrating bit rate error versus word line number according to an example embodiment.

In FIG. 3, curve 302 represents an example bit error rate for a population of pages associated with the least significant bit of each cell on the word line immediately after being written. The error rates are ordered by word line number, which also corresponds to relative order of the respective pages. As this curve 302 represents, the highest bit rate error occurs for the lowest word line number, due to program disturb as described above. Also shown in this graph is curve 304, which represents the bit error rate for an equivalent population of memory pages three months after being initially programmed. Note that this curve 304 illustrates to opposite trend of bit error rate versus word line, namely that the bit error rate increases for higher word lines.

Analysis has shown that excessive charge loss in a cell is correlated with the stored data pattern on the NAND string below the cell. For example, if lower cells on the NAND string have been programmed to higher symbol levels (e.g., distributions/symbols 204 and 205 in FIG. 2A) the charge loss in the target cell is more likely. Charge loss can be mitigated by using a variable read threshold voltage ("intelligent reads"). This may involve adjusting one or more read thresholds such as THB, THA, and THC shown in FIGS. 2A-2B when reading back memory cells. However, it may be desirable to provide input to the intelligent read process (e.g., how much charge loss, which direction) so that recovery operations can converge on a solution more quickly.

In embodiments described herein, the total amount of charge stored in cells located in the NAND strings below the failing page can be used as a predictor of charge loss in the cell. This predictive information can then be used to correct for read errors in the affected cell. There are a number of ways in which this information can be determined. One way the estimate can be obtained is to finding the symbol levels of each cell by reading the page information. The symbol levels can be summed after applying a suitable weighting factor. In general, the effective loss of charge at cell m can be estimated as shown below in Equation 1, where w is a weighting factor dependent on symbol level $L_i$.

$$\Delta Q = k \sum_{i=0}^{m-1} w(L_i) \quad [1]$$

In the case of two-bit MLC cells, one choice is to ignore cells which have been programmed to one of the lowest two symbol level and weight equally cells which have been programmed to one of the two highest symbol levels. This corresponds to the set w={0, 0, 1, 1} for symbols L={$L_0$, $L_1$, $L_2$, $L_3$}. In some configurations, e.g., L={11, 01, 00, 10}, an equivalent indicator can be obtained by reading just the LSB page on each word line and then summing the LSB bit information from the cells below the failing page. A lower than average value of the LSB sum in such a case means that the cumulative value of charge of cells below the failing page are higher than average, and vice versa. Assuming there are two pages per word line, this can be obtained by reading every other page on the block. These techniques may be used in error recovery strategies where it can be used to, for example, select optimum read threshold voltages or modify the log-likelihood ratios of decoder input symbols, Other sets of weighting factors can be used to obtain estimates of total charge. For example, the set $w_L$={-1, 0, 1, 2} may more closely match the expected charge loss. In such a case, the charge loss value $\Delta Q$ is inversely proportional to the sum of the bit values in the LSB pages below a given page. Or where a different Gray coding scheme is used, different summations can be performed. For example, for L={11, 10, 00, 01}, a similar result to the LSB sum described above could be obtained in this Gray code using the MSB of each symbol.

Figure 4:
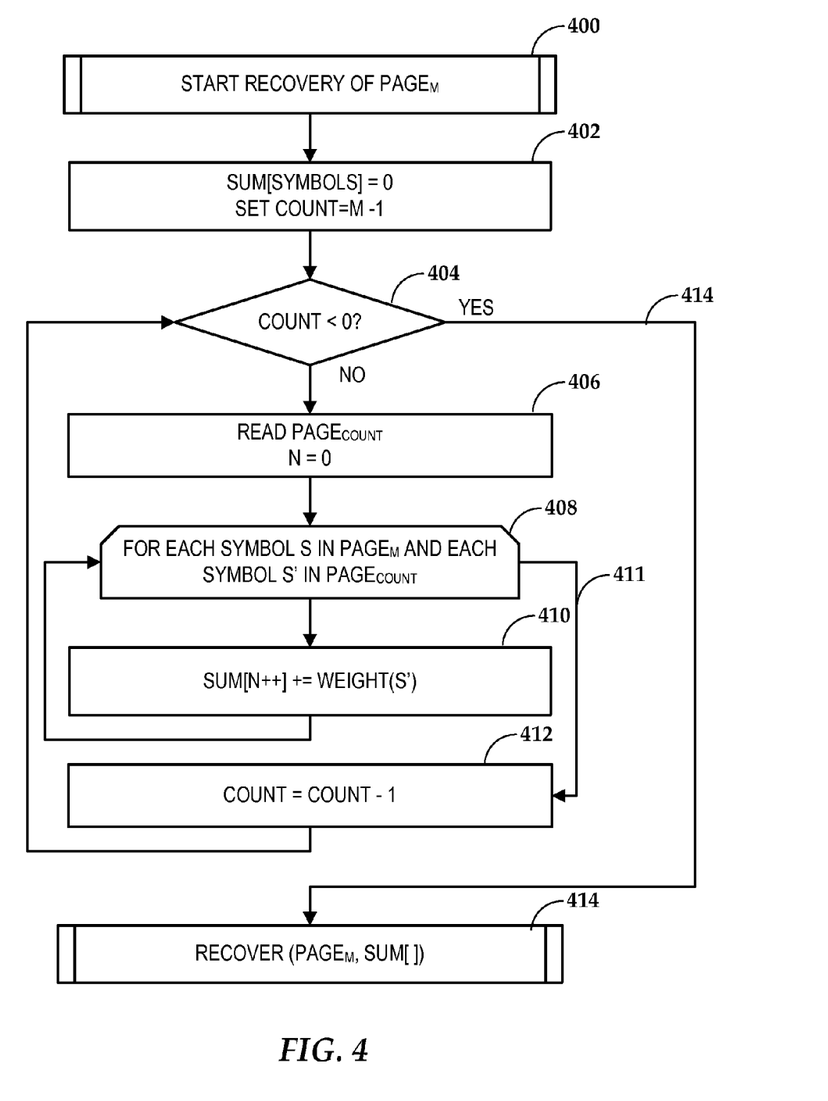
FIG. 4 is a flowchart illustrating determination of cumulative background charges as part of a recovery operation according to an example embodiment.

In FIG. 4, a flowchart illustrates an example procedure 400 for determining these sum values according to an example embodiment. The procedure is entered in response to, e.g., when read errors on $PAGE_M$ exceeds the ECC capability of correction. This page may generally be a higher page on to the NAND string (where lower pages are closer to ground). In one variation, the routine 400 may be entered only if the value of M exceeds some value (e.g., lies in the upper half of word lines). Some variable are initialized at 402, which include an array SUM for holding a summation value for each symbol in $PAGE_M$. A COUNT variable, used for iterating through the lower word lines, is also initialized at block 402 to the value M-1.

A test at block 404 is the entry point for a loop where COUNT is incremented from M-1 to zero. For each value of COUNT, data from $PAGE_{COUNT}$ is read 406 into memory. The variable COUNT generally refers to the word line. Because there may be more than one page per word line, the address of $PAGE_{COUNT}$ may or may not be incremented/decremented by the COUNT variable. For example, if there are two pages per word line, the address of $PAGE_{COUNT}$ would be decremented by two for each decrement of COUNT by one.

Figure 6A:
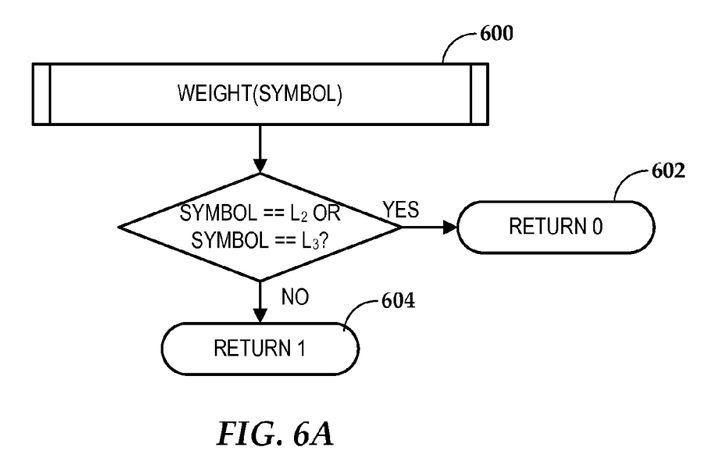
FIGS. 6A and 6B are flowcharts illustrating weighting functions according to example embodiments.
Figure 6B:
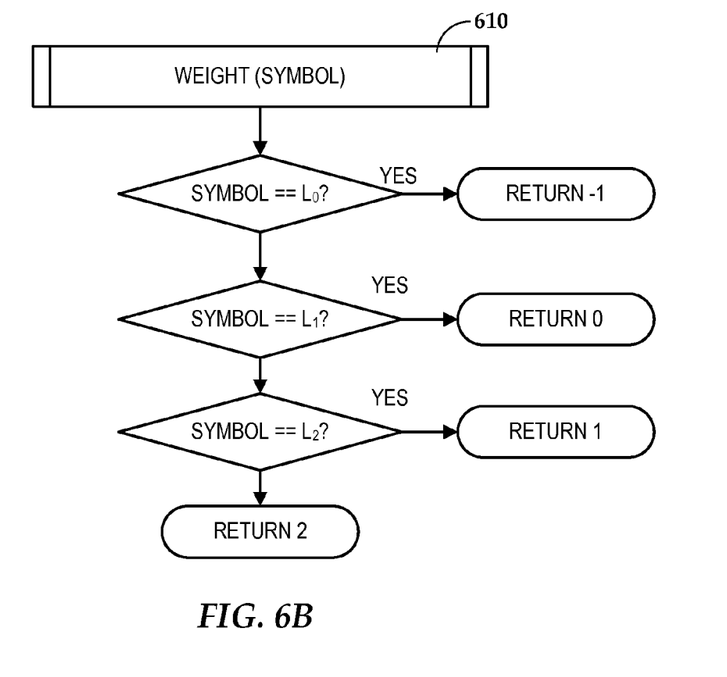

Another loop 408 iterates through each symbol in the current page, and adds a value to the respective element of SUM array. For example, if the page is 4096 bits wide (512 bytes) page, the value N incremented in the loop may increment from 0 to 4095. This loop 408 also iterates through the corresponding symbols S' of the currently selected page, $PAGE_{COUNT}$. The function WEIGHT is called to determine what value is added based on the value of S'. Example implementations of the WEIGHT function are shown in FIGS. 6A and 6B. When loop 408 terminates (via path 411), the value of COUNT is decremented, and loop 404 continues. At the termination of loop 404 (via path 414), then a recovery procedure is performed on $PAGE_M$ using the value of the SUM array.

Once the total charge estimate (as represented by the SUM array) has been obtained, the estimate may be used in a number of ways. One approach relies on a variable read threshold feature. Such an implementation according to an example embodiment is shown by way of a flowchart in FIG. 5A. This procedure 500 involves reading 502 the failing page three times. The first time the page is read with a nominal threshold (page, cycle and retention time dependent). The second and third times, the page is read with a positive and a negative change (+dV/-dV) to the nominal threshold. Codeword symbols are then assigned 504 information from the nominal read when the estimate charge is close to average and from the positive/negative read operations when the estimated charge is below/above average.

Figure 5A:
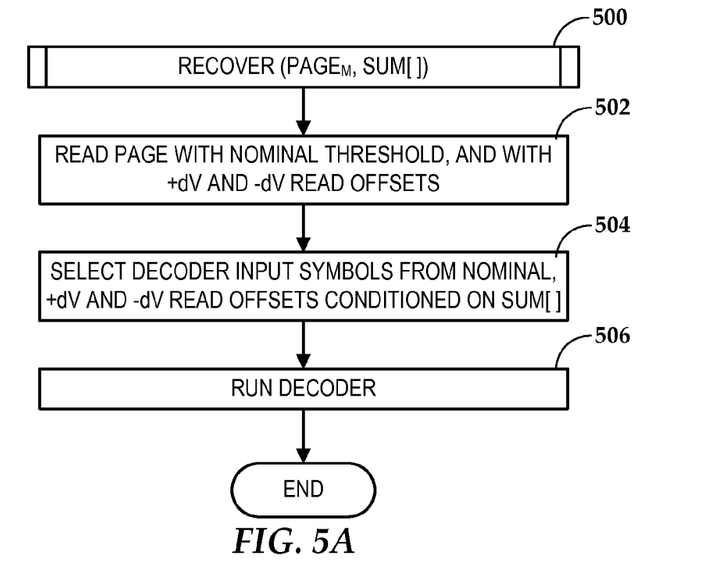
FIGS. 5A and 5B are flowcharts illustrating recovery procedures according to example embodiments.

For example, if an LSB sum for a particular symbol is sum <M/2 (meaning higher than average occurrence of high charge state symbols $L_2$, $L_3$), then decision may be selected from larger read offsets (+dV/−dV). Otherwise if the sum >M/2, the decision may be selected from a smaller read offsets. The decoder is then run 506 with these input symbols. This procedure can be generalized to more read operations than three, and may skew the read operations in one direction (e.g., +dV$_1$ and +dV$_2$ instead of using a negative offset). The read offsets may also be adjusted further based on M, e.g., if M is greater than some ratio of the total number of word lines in the memory, M$_W$ (e.g., M>1/2 M$_W$).

Figure 5B:
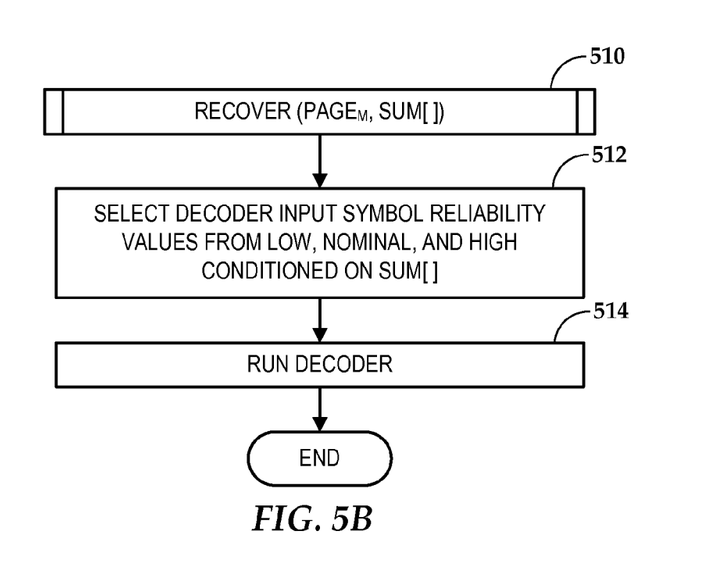

Another approach, shown in the flowchart of FIG. 5B relies on the use of a soft decoder, where reliability estimates are added to the hard decisions obtained from the flash memory read operation. Analogous to the previous approach 500, the estimated charge in the NAND strings below the code word information (e.g., SUM array) is used as input. In this procedure 510, the estimated charge value is used to set 512 the reliability input values to the decoder such that bits corresponding to strings with a high charge level are assigned a low reliability under the assumption that they will likely show evidence of a larger charge loss. Strings with average or less than average estimated charge will accordingly be assigned a medium or high reliability estimate. This means if an LSB sum is used as a measure of charge, reliability may be decreased for <M/2, and increased for sum >M/2. These reliability measures can be further adjusted based on the value M, e.g., if M is greater than some ratio of the total number of word lines in the memory. The decoder is then run 514 with this information.

A previously mentioned, there are a number of different ways to estimate the cumulated background charge of cells located in NAND strings below a failing page of solid-state, non-volatile memory. FIGS. 6A and 6B show two example procedures 600, 610. These procedures 600, 610 are invoked in the procedure 400 of FIG. 4, and for purposes of reference and not limitation, are given the function name WEIGHT. Procedure 600 is functionally equivalent to returning the LSB or MSB of the symbol for at least some of the Gray codes discussed above, e.g., where L$_2$="00" and L$_3$="10" or "01." This procedure 500 may also exhibit the inverse behavior (e.g., return blocks 602 and 604 swapped) depending on the desired characteristics of the SUM array described in FIG. 4. Procedure 610 returns a value ranging from −1 to 2, with larger values representing more charge stored in the cells relative to the erased state (L$_0$).

Figure 7A:
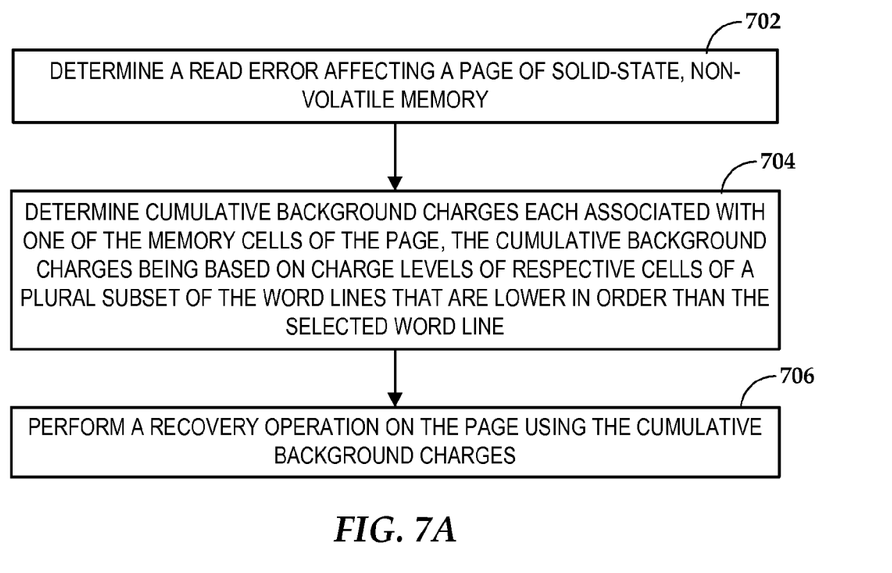
FIGS. 7A and 7B are flowcharts illustrating recovery procedures according to example embodiments.

In reference now to FIG. 7A, a flowchart illustrates another procedure according to an example embodiment. A read error (e.g., a sufficient number of read errors exceeding the correction capability of the EEC system) affecting a page of solid-state, non-volatile memory is determined 702. The read errors may be due to time dependent data retention errors. The page is associated with a selected word line that crosses a plurality of NAND strings coupled to respective grounds and bit lines. Word lines of the memory are ordered from a lower end proximate the ground to a higher end proximate the bit lines.

Cumulative background charges are then determined 704, each associated with one of the memory cells of the page. The cumulative background charges are based on charge levels of respective cells of a plural subset of the word lines that are lower in order than the selected word line. Determining cumulative background charges may involve summing symbol data stored on the respective cells of the plural subset of word lines.

Summing the symbol data may involve summing the least significant bits (or most significant bits) of the symbol data. This may also involve weighting the symbol data based on an amount of stored charge associated with respective symbols of the symbol data. The weighting may, for example, assign a zero value to a portion of the respective symbols having a lower amount of stored charge and a non-zero value to remaining portion of the respective symbols having a higher amount of stored charge.

A recovery operation is then performed 706 on the page using the cumulative background charges. The recovery operation may involve reading the page with voltage thresholds that include a nominal threshold, and positive and negative offsets from the nominal threshold. Decoder input symbols may be selected from the voltage thresholds conditioned on the summed symbol data. Alternatively, performing the recovery operation on the page may involve selecting decoder input reliability values conditioned on the summed symbol data.

Figure 7B:
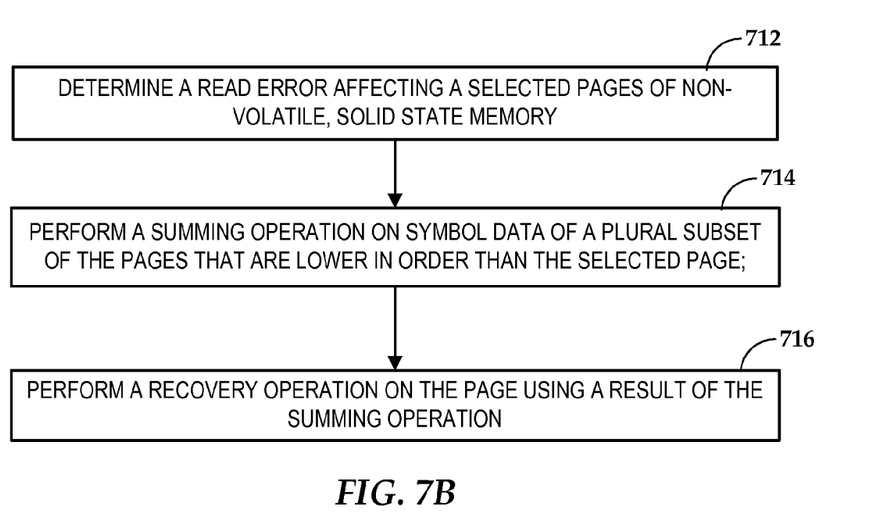

In reference now to FIG. 7B, a flowchart illustrates another procedure according to an example embodiment. A read error affecting a page of solid-state, non-volatile memory is determined 712. The read error may be due to a time dependent data retention error. The non-volatile, solid-state memory includes a plurality of NAND strings coupled to respective grounds and bit lines. A plurality of pages of the memory are ordered from a lower end proximate the ground to a higher end proximate the bit line.

A summing operation is performed 714 on symbol data of a plural subset of the pages that are lower in order than the selected page. The summing operation may determine cumulative background charges stored on cells of the plural subset of pages. In such a case, each of the cumulative charges affects data retention properties of corresponding cells of the selected page. Summing the symbol data may involve summing one of a least significant bit and a most significant bit of the symbol data. The symbol data may be weighted prior to being summed based on an amount of stored charge associated with respective symbols of the symbol data. A recovery operation is performed 716 on the page using a result of the summing operation.

It is to be understood that the flowcharts above are provided for purposes of illustration and not limitation. The illustrated procedures need not follow the precise order listed, and some operations may be performed in parallel. For example, the loop 408 shown in FIG. 4 may be performed on an entire page at once, e.g., by logically combining a masking value with a page value to read MSB/LSB, and using the resulting value to derive a sum. Similarly, the functions shown in FIGS. 6A-6B can be performed with equivalent logical operations, lookup tables, or other alternative operations.

Figure 8:
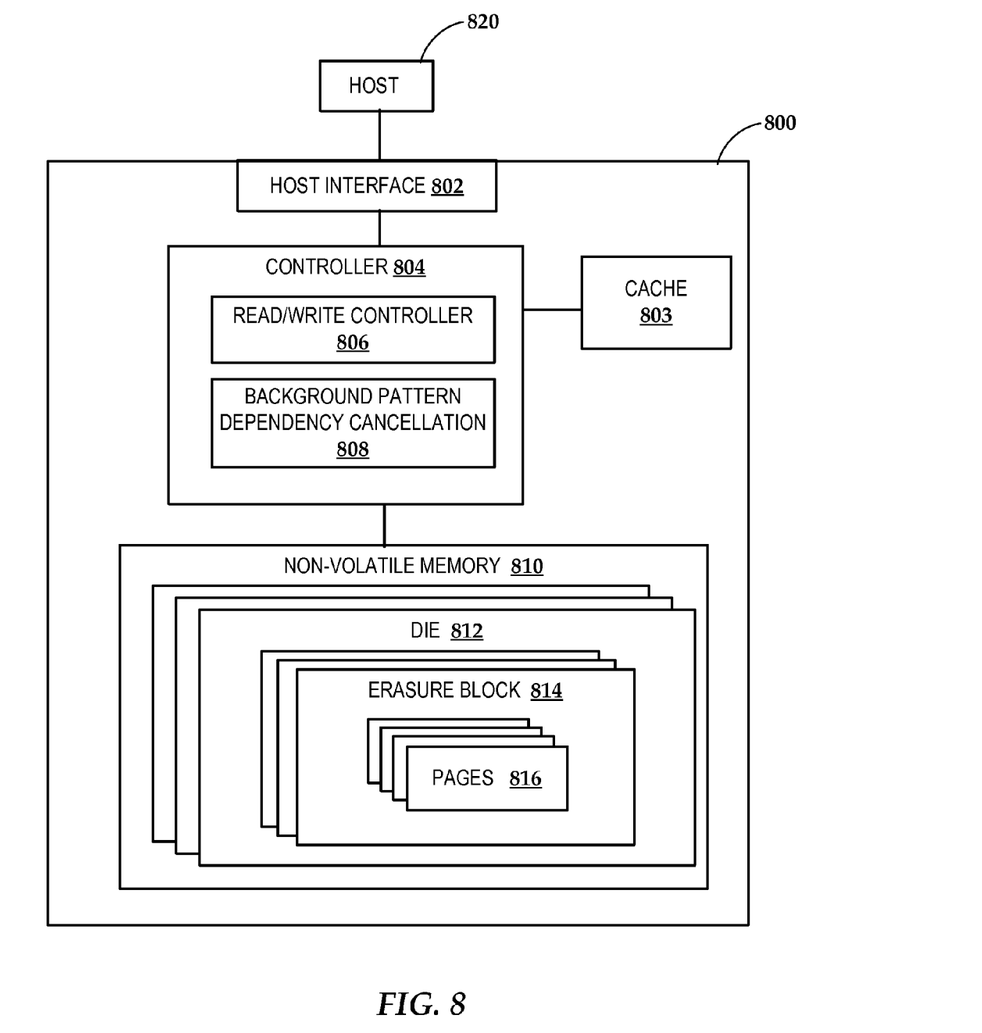
FIG. 8 is a block diagram of an apparatus according to an example embodiment.

In reference now to FIG. 8, a block diagram illustrates an apparatus 800 according to an example embodiment. The apparatus 800 may be any type of persistent solid-state storage device, including a solid-state drive (SSD), thumb drive, memory card, embedded device storage, etc. The apparatus 800 may include a host interface 802 facilitates communications between the apparatus 800 and the host system 803, e.g., a computer. The apparatus 800 also includes media, here shown as solid-state, non-volatile memory 810. A host 820 can store data on the memory 810 and read data from the memory 810 via the host interface 802, which hides the operation of internal components of the apparatus 800 from the host 820.

The non-volatile memory 810 includes the circuitry and media used to persistently store both user data and other data managed internally by apparatus 800. The non-volatile memory 810 may include one or more flash dies 812, which individually contain a portion of the total storage capacity of the apparatus 800. The memory contained within individual dies 812 may be further partitioned into blocks, here annotated as erasure blocks/units 814. The erasure blocks 814 represent the smallest individually erasable portions of memory 810. The erasure blocks 814 in turn include a number of pages 816 that represent the smallest portion of data that can be individually programmed or read. In a NAND configuration, for example, the page sizes may range from 512 bytes to 4 kilobytes (KB), and the erasure block sizes may range from 16 KB to 512 KB. It will be appreciated that the present embodiments described herein are not limited to any particular size of the pages 816 and blocks 814, and may be equally applicable to smaller or larger data unit sizes.

The apparatus 800 includes one or more controllers 804, which may include general- or special-purpose processors that perform operations of the apparatus. The controller 804 may include any combination of microprocessors, digital signal processor (DSPs), application specific integrated circuits (ASICs), field programmable gate arrays (FPGAs), or other equivalent integrated or discrete logic circuitry suitable for performing the various functions described herein.

Functions that may be provided by the controller 804 include read/write operations, which are represented by functional module 806. The module 806 may handle operations such as physical-to-logical address translation, verification of read/write operations, decoding, application of error correction codes (ECC), etc. Another module, here shown as background pattern dependency cancellation (BPDC) module 808, may perform the operations described hereinabove related to correction of data retention errors. Those operations may include the detection of a read error, identification of factors that may trigger application of BPDC (e.g., high page number, elapsed time since page was programmed), and facilitate operations that allow recovery of data using data descriptive of cumulative NAND string charges of lower pages. The modules 806, 808 may be implemented using any combination of hardware, software, and firmware, and may cooperatively perform functions related to data retention error correction as described herein.

The various embodiments described above may be implemented using circuitry and/or software modules that interact to provide particular results. One of skill in the computing arts can readily implement such described functionality, either at a modular level or as a whole, using knowledge generally known in the art. The structures and procedures shown above are only a representative example of embodiments that can be used to increase life of data storage devices as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
    determining a read error affecting a page of solid-state, non-volatile memory, wherein the page is associated with a selected word line that crosses a plurality of NAND strings coupled to respective grounds and bit lines, wherein word lines of the memory are ordered from a lower end proximate the ground to a higher end proximate the bit lines;
    determining cumulative background charges each associated with one of the memory cells of the page, wherein the cumulative background charges are based on charge levels of respective cells of a plural subset of the word lines that are lower in order than the selected word line; and
    performing a recovery operation on the page using the cumulative background charges.

2. The method of claim 1, wherein determining cumulative background charges comprises summing symbol data stored on the respective cells of the plural subset of word lines.

3. The method of claim 2, wherein summing the symbol data comprises summing at least one of least significant bits and most significant bits of the symbol data.

4. The method of claim 2, performing the recovery operation on the page comprises:
    reading the page with voltage thresholds that comprise a nominal threshold, and positive and negative offsets from the nominal threshold; and
    selecting decoder input symbols from the voltage thresholds conditioned on the summed symbol data.

5. The method of claim 2, performing the recovery operation on the page comprises selecting decoder input reliability values conditioned on the summed symbol data.

6. The method of claim 2, further comprising weighting the symbol data based on an amount of stored charge associated with respective symbols of the symbol data, wherein the weighting assigns a lower value to a first portion of the respective symbols having a lower amount of stored charge and a higher value to a remaining portion of the respective symbols having a higher amount of stored charge.

7. The method of claim 1, wherein the read error comprises an inability to recover the data using an error correction code.

8. The method of claim 1, wherein the read error is due to time a dependent data retention error.

9. An apparatus comprising:
    a controller capable of being coupled to a non-volatile, solid-state memory comprising a plurality of NAND strings coupled to respective grounds and bit lines, wherein a plurality of word lines of the memory are ordered from a lower end proximate the ground to a higher end proximate the bit lines, and wherein the controller is configured to:
        determine a read error affecting a page associated with a selected word line of the plurality of word lines;
        determine cumulative background charges each associated with one of the memory cells of the page, wherein the cumulative background charges are based on charge levels of respective cells of a plural subset of the word lines that are lower in order than the selected word line; and
        perform a recovery operation on the page using the cumulative background charges.

10. The apparatus of claim 9, wherein determining cumulative background charges comprises summing symbol data stored on the respective cells of the plural subset of word lines.

11. The apparatus of claim 10, wherein summing the symbol data comprises summing at least one of least significant bits and most significant bits of the symbol data.

12. The apparatus of claim 10, performing the recovery operation on the page comprises:
    reading the page with voltage thresholds that comprise a nominal threshold, and positive and negative offsets from the nominal threshold; and
    selecting decoder input symbols from the voltage thresholds conditioned on the summed symbol data.

13. The apparatus of claim 10, wherein performing the recovery operation on the page comprises selecting decoder input reliability values conditioned on the summed symbol data.

14. The apparatus of claim 10, wherein the controller is further configured to weight the symbol data based on an amount of stored charge associated with respective symbols of the symbol data.

15. The apparatus of claim 14, wherein the weighting assigns a lower value to a portion of the respective symbols having a lower amount of stored charge and a higher value to a remaining portion of the respective symbols having a higher amount of stored charge.

16. The apparatus of claim 9, wherein the read error is due to time a dependent data retention error.

17. An apparatus comprising:
a controller capable of being coupled to a non-volatile, solid-state memory comprising a plurality of NAND strings coupled to respective grounds and bit lines, wherein a plurality of pages of the memory are ordered from a lower end proximate the ground to a higher end proximate the bit lines, and wherein the controller is configured to:

determine a read error affecting a selected one of the pages;

perform a summing operation on symbol data of a plural subset of the pages that are lower in order than the selected page; and perform a recovery operation on the page using a result of the summing operation.

18. The apparatus of claim 17, wherein the summing operation determines cumulative background charges stored on cells of the plural subset of pages, wherein each of the cumulative charges affects data retention properties of corresponding cells of the selected page.

19. The apparatus of claim 17, wherein summing the symbol data comprises summing one of least significant bits and most significant bits of the symbol data.

20. The apparatus of claim 17, wherein the controller is further configured to weight the symbol data prior to being summed based on an amount of stored charge associated with respective symbols of the symbol data.

* * * * *